(12) United States Patent
Lee et al.

(10) Patent No.: US 11,031,575 B2
(45) Date of Patent: Jun. 8, 2021

(54) DISPLAY DEVICE

(71) Applicant: Samsung Display Co., Ltd., Yongin-si (KR)

(72) Inventors: Haeyeon Lee, Yongin-si (KR); Jinoh Kwag, Yongin-si (KR); Dongsoo Kim, Yongin-si (KR); Jieun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/829,622

(22) Filed: Dec. 1, 2017

(65) Prior Publication Data

US 2018/0159077 A1  Jun. 7, 2018

(30) Foreign Application Priority Data

Dec. 5, 2016 (KR) .................. 10-2016-0164384

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3244* (2013.01); *H01L 51/5246* (2013.01); *H01L 27/3223* (2013.01); *H01L 27/3276* (2013.01); *H01L 51/0097* (2013.01); *H01L 2251/5338* (2013.01)

(58) Field of Classification Search
CPC combination set(s) only.
See application file for complete search history.

(56) References Cited

U.S. PATENT DOCUMENTS

2010/0200846 A1\* 8/2010 Kwack ............... H01L 51/5253
257/40
2015/0024170 A1  1/2015 Min et al.
(Continued)

FOREIGN PATENT DOCUMENTS

KR          10-0751376 B1   8/2007
KR      10-2015-0010036 A   1/2015
(Continued)

*Primary Examiner* — Michelle Mandala
*Assistant Examiner* — Jordan M Klein
(74) *Attorney, Agent, or Firm* — Lewis Roca Rothgerber Christie LLP (57) ABSTRACT

A display device includes a substrate including a display area and a peripheral area, a first insulating layer on the substrate, a first dam in the peripheral area and separated from the first insulating layer, an electrode power supply line on the substrate between the first insulating layer and the first dam, a protection conductive layer on the first insulating layer, extending over the electrode power supply line, electrically connected to the electrode power supply line, and including an uneven structure on an upper surface thereof, a pixel electrode on the first insulating layer, an opposite electrode on the pixel electrode, and contacting the protection conductive layer by extending to the peripheral area, and an encapsulation layer on the opposite electrode, and having a lower surface that contacts the upper surface of the protection conductive layer in a region where the protection conductive layer overlaps the electrode power supply line.

15 Claims, 8 Drawing Sheets

(56) References Cited

U.S. PATENT DOCUMENTS

| | | | |
|---|---|---|---|
| 2015/0060786 A1* | 3/2015 | Kwak | H01L 51/5253 257/40 |
| 2015/0228927 A1* | 8/2015 | Kim | H01L 51/5246 257/40 |
| 2016/0079564 A1* | 3/2016 | Shim | H01L 51/5256 257/40 |
| 2016/0218319 A1* | 7/2016 | Kim | H01L 51/5256 |
| 2016/0226026 A1 | 8/2016 | Kwak | |
| 2017/0069873 A1* | 3/2017 | Kim | H01L 51/5253 |
| 2018/0097034 A1* | 4/2018 | Lee | H01L 27/156 |

FOREIGN PATENT DOCUMENTS

| | | |
|---|---|---|
| KR | 10-2015-0025260 A | 3/2015 |
| KR | 10-2015-0094950 A | 8/2015 |
| KR | 10-2016-0093161 A | 8/2016 |

* cited by examiner

DISPLAY DEVICE

CROSS-REFERENCE TO RELATED APPLICATION

This application claims priority to, and the benefit of, Korean Patent Application No. 10-2016-0164384, filed on Dec. 5, 2016 in the Korean Intellectual Property Office, the disclosure of which is incorporated herein in its entirety by reference.

BACKGROUND

1. Field

One or more embodiments relate to a display device in which exfoliation between components is prevented or reduced.

2. Description of the Related Art

In general, various layers are stacked in a display device. For example, in the case of an organic light-emitting display device, sub-pixels each include an organic emission device that includes a pixel electrode, an intermediate layer including an emission layer, and an opposite electrode. In addition, the organic light-emitting display device further includes an encapsulation layer covering the organic emission device to protect the organic emission device from external moisture, impurities, or the like. The organic light-emitting display device may include various layers in addition to the encapsulation layer. Other display devices, such as a liquid display device, may also include various layers.

However, during the manufacture of an existing display device, or during use of the display device after manufacture, some layers may be exfoliated.

SUMMARY

One or more embodiments include a display device, in which exfoliation between components is prevented or reduced. However, one or more embodiments are examples, and the scope of the present disclosure is not limited thereto.

Additional aspects will be set forth in part in the description which follows and, in part, will be apparent from the description, or may be learned by practice of the presented embodiments.

According to one or more embodiments, a display device includes a substrate including a display area and a peripheral area in an outer region of the display area, a first insulating layer on the substrate across the display area and the peripheral area, a first dam in the peripheral area and separated from the first insulating layer, an electrode power supply line on the substrate, and including a part between the first insulating layer and the first dam, a protection conductive layer on the first insulating layer, extending over the electrode power supply line, electrically connected to the electrode power supply line, and including an uneven structure on an upper surface thereof, a pixel electrode on the first insulating layer in the display area, an opposite electrode on the pixel electrode, and contacting the protection conductive layer by extending to the peripheral area, and an encapsulation layer on the opposite electrode, and having a lower surface that contacts the upper surface of the protection conductive layer in the peripheral area in a region where the protection conductive layer overlaps the electrode power supply line.

The electrode power supply line may include a first pattern, and the upper surface of the protection conductive layer may include an uneven structure corresponding to the first pattern.

In the region where the protection conductive layer overlaps at least the electrode power supply line, at least one layer under the electrode power supply line may include a second pattern, and the upper surface of the protection conductive layer may include an uneven structure corresponding to the second pattern.

The display device may further include a thin film transistor electrically connected to the pixel electrode, wherein an interlayer insulating layer on a gate electrode of the thin film transistor extends toward the peripheral area, and includes the second pattern in the peripheral area.

The display device may further include a dummy pattern under the electrode power supply line in the region where the protection conductive layer overlaps at least the electrode power supply line.

The display device may further include a thin film transistor electrically connected to the pixel electrode, and including a gate electrode, wherein the dummy pattern includes a same material as the gate electrode.

The display device may further include a capping layer between the opposite electrode and the encapsulation layer, extending toward an outer side of the opposite electrode, and having an end portion on the first insulating layer.

The first insulating layer may define an opening in the peripheral area, and the end portion of the capping layer may be between an end portion of the first insulating layer and the opening.

The protection conductive layer may fill the opening of the first insulating layer.

The display device may further include a protection layer between the capping layer and the encapsulation layer.

The encapsulation layer may include a first inorganic encapsulation layer, an organic encapsulation layer, and a second inorganic encapsulation layer, which are sequentially stacked, and the upper surface of the protection conductive layer may include an uneven structure that contacts a lower surface of the first inorganic encapsulation layer.

The first inorganic encapsulation layer and the second inorganic encapsulation layer may contact each other at an outer circumference of the first dam.

In the region where the protection conductive layer overlaps at least the electrode power supply line, the first inorganic encapsulation layer may include an upper surface corresponding to the uneven structure.

The display device may further include a second dam between the first dam and the first insulating layer, wherein at least a portion of the second dam is on the protection conductive layer.

A height of the first dam from the substrate may be greater than a height of the second dam from the substrate.

BRIEF DESCRIPTION OF THE DRAWINGS

These and/or other aspects will become apparent and will be more readily appreciated from the following description of the embodiments, taken in conjunction with the accompanying drawings, in which.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
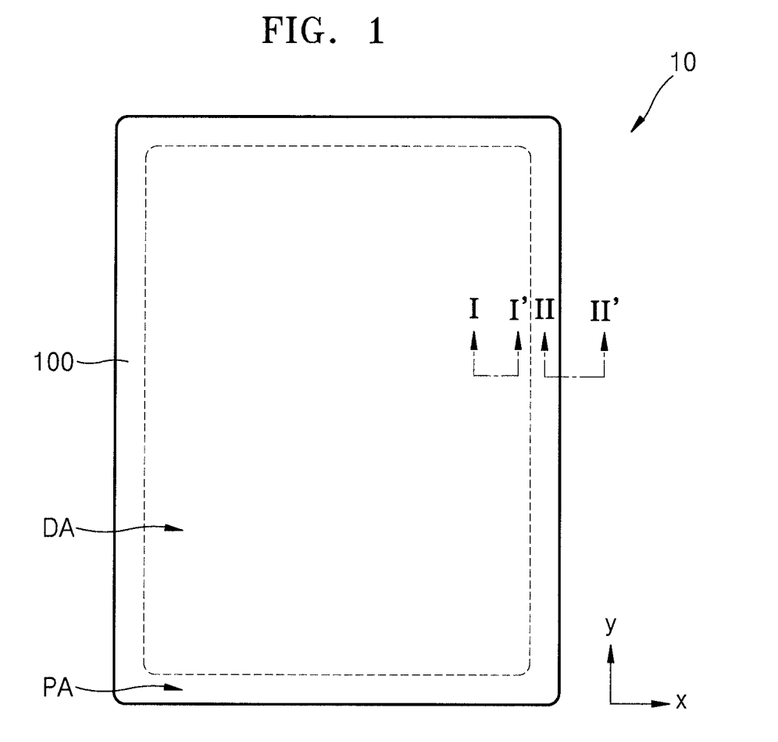
FIG. 1 is a schematic plan view of a portion of a display device according to an embodiment.
Figure 2:
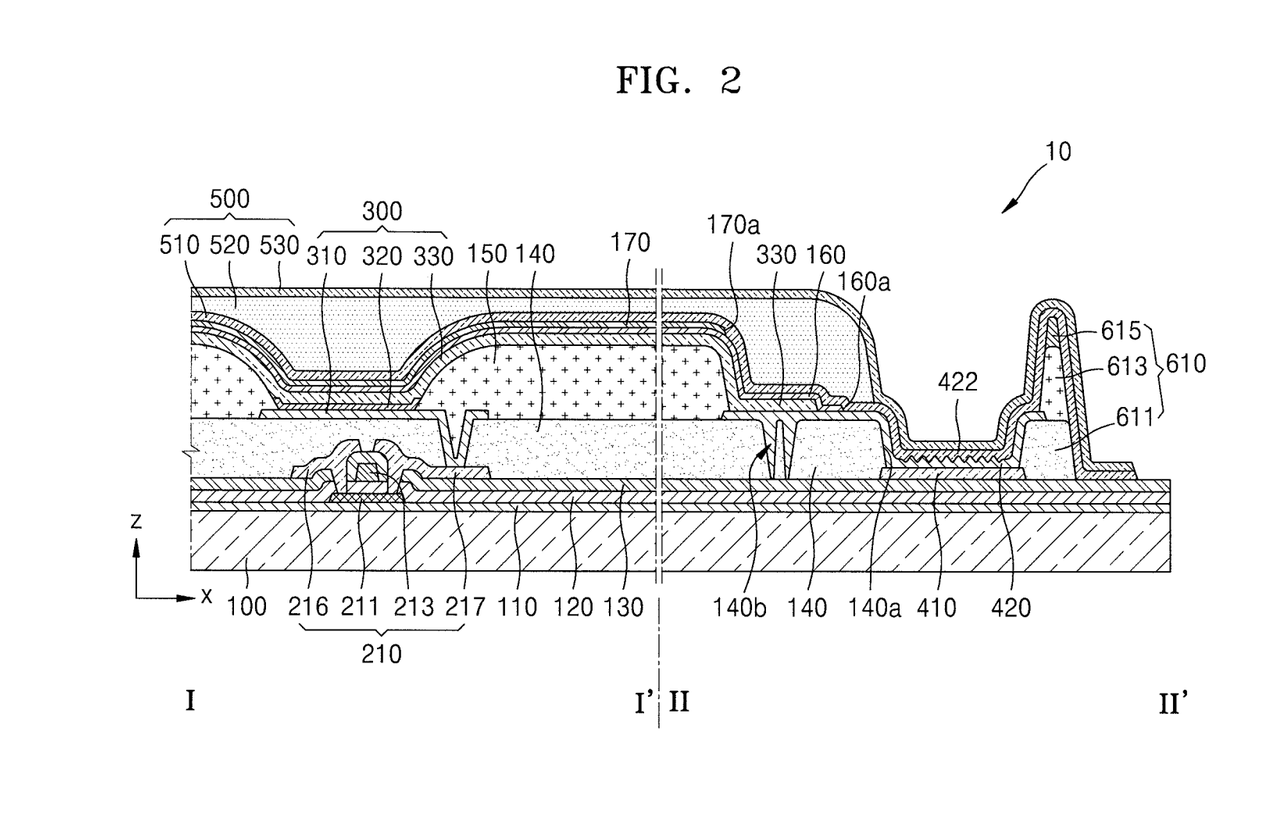
FIG. 2 is a schematic cross-sectional view taken along the line I-I' and the line II-II' of FIG. 1.
Figure 3:
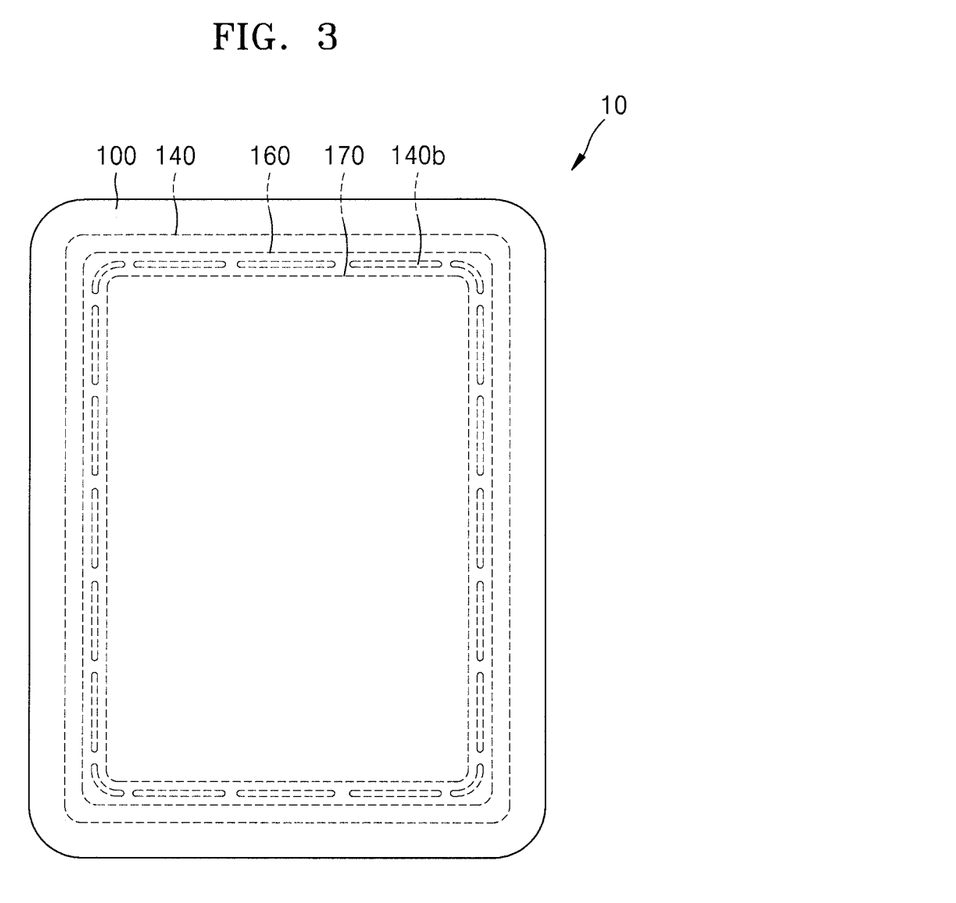
FIG. 3 is a schematic conceptual view of a correlation between components of a display device of FIG. 2.

FIG. 1 is a schematic plan view of a portion of a display device 10 according to an embodiment. FIG. 2 is a cross-sectional view taken along the line I-I' and the line II-II' of FIG. 1. FIG. 3 is a schematic conceptual view of a correlation between components of the display device 10 of FIG. 2.

The display device 10 according to the present embodiment includes various components including a substrate 100. The substrate 100 includes a display area DA and a peripheral area PA in an outer region of the display area DA. The substrate 100 may include various materials, e.g., a glass material, a metal material, a plastic material, etc. When the substrate 100 is a flexible substrate, the substrate 100 may include polymer resin such as polyether sulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

As a selective example, the substrate 100 may have a structure including two plastic substrates and an inorganic layer therebetween. The two plastic substrates may each include the above-listed polymer resin, and may have either the same thickness or different thicknesses. For example, each plastic substrate may include PI, and may have a thickness of about 3 µm to about 20 µm. The inorganic layer may be a barrier layer that prevents or reduces penetration of external impurities, and may be a layer or multiple layers including an inorganic material, for example, silicon nitride (SiNx) and/or silicon oxide (SiOx). The inorganic layer may have a thickness of about 6000 Å. However, one or more embodiments are not limited thereto.

A thin film transistor 210 is in the display area DA of the substrate 100, and a display element electrically connected to the thin film transistor 210 may also be in the display area DA. FIG. 2 shows an organic light-emitting element 300 as a display element. Hereinafter, for convenience, a case where the display device 10 includes the organic light-emitting element 300 as a display element is described. The fact that the organic light-emitting element 300 that is the display element is electrically connected to the thin film transistor 210 may indicate that a pixel electrode 310 of the organic light-emitting element 300 is electrically connected to the thin film transistor 210. A thin film transistor may also be in the peripheral area PA of the substrate 100. The thin film transistor in the peripheral area PA may be, for example, part of a circuit portion for controlling an electrical signal transmitted to the display area DA.

The thin film transistor 210 includes a semiconductor layer 211 including amorphous silicon, polycrystalline silicon, or an organic semiconductor material, a gate electrode 213, a source electrode 216, and a drain electrode 217. On the substrate 100, a buffer layer 110 including SiOx, SiNx, silicon oxynitride, or the like is located to flatten a surface of the substrate 100, or to prevent or reduce penetration of impurities, etc. into the semiconductor layer 211. The semiconductor layer 211 may be on the buffer layer 110.

The gate electrode 213 may be above the semiconductor layer 211. The gate electrode 213 may be a layer or may be multiple layers including, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), by taking into account adhesion to an adjacent layer, surface flatness of a stacked layer, workability, etc. In this case, a gate insulating layer 120 including SiOx, SiNx, silicon oxynitride, or the like may be between the semiconductor layer 211 and the gate electrode 213 to insulate the semiconductor layer 211 from the gate electrode 213.

An interlayer insulating layer 130 may be on the gate electrode 213 and may be a layer or multiple layers including SiOx, SiNx, silicon oxynitride, or the like.

The source electrode 216 and the drain electrode 217 may be on the interlayer insulating layer 130. The source electrode 216 and the drain electrode 217 may each be electrically connected to the semiconductor layer 211 through contact holes formed in the interlayer insulating layer 130 and in the gate insulating layer 120.

The source electrode 216 and the drain electrode 217 may each be a layer or layers including, for example, at least one of Al, Pt, Pd, Ag, Mg, Au, Ni, Nd, Ir, Cr, Li, Ca, Mo, Ti, W, and Cu, by taking conductivity, etc. into account.

A protection layer that covers the thin film transistor 210 may protect the thin film transistor 210, and the like. The protection layer may include an inorganic material, for example, SiOx, SiNx, silicon oxynitride, or the like. The protection layer may be a single layer or may be multiple layers.

A planarization layer 140 may be on the protection layer. For example, as shown in FIG. 2, when the organic light-emitting element 300 is above the thin film transistor 210, the planarization layer 140 may substantially flatten an upper surface of the protection layer that covers the thin film transistor 210. The planarization layer 140 may include, for example, a general-purpose polymer such as poly(methyl methacrylate) (PMMA) or Polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and/or a combination thereof. However, one or more embodiments are not limited thereto. Also, FIG. 2 shows that the planarization layer 140 is a single layer, but may be a multilayer. The display device 10 according to the present embodiment may include both the protection layer and the planarization layer 140, or may include only the planarization layer 140, according to suitability. The planarization layer 140 may be referred to as a first insulating layer for convenience.

In the display area DA of the substrate 100, the organic light-emitting element 300 may include the pixel electrode 310, an opposite electrode 330, and an intermediate layer 320 between the pixel electrode 310 and the opposite electrode 330. The intermediate layer 320 may include an emission layer, and may be located on the planarization layer 140.

An opening is formed in the planarization layer 140 to expose at least one of the source electrode 216 and the drain electrode 217 of the thin film transistor 210, and through the opening, the pixel electrode 310 that contacts any one of the source electrode 216 and the drain electrode 217, and that is electrically connected to the thin film transistor 210, may be on the planarization layer 140. The pixel electrode 310 may be a transparent (translucent) electrode or a reflective electrode. When the pixel electrode 310 is a (translucent) transparent electrode, the pixel electrode 310 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 310 is a reflective electrode, the pixel electrode 310 may include, for example, a reflection layer including Ag, Mg, Al, Pt, Pd, Au, Ni, Nd, Ir, Cr, and/or a combination thereof, and may include a layer including ITO, IZO, ZnO, $In_2O_3$, IGO, or AZO. However, one or more embodiments are not limited thereto. The pixel electrode 310 may include various materials and may have various structures, for example, a single-layer structure, a multilayer structure, or the like.

A pixel-defining layer 150 may be on the planarization layer 140. The pixel-defining layer 150 defines pixels by including an opening corresponding to each sub-pixel, that is, an opening that exposes at least a central portion of the pixel electrode 310. In addition, as shown in FIG. 2, the pixel-defining layer 150 increases a distance between an edge of the pixel electrode 310 and the opposite electrode 330 above the pixel electrode 310 so as to prevent generation of electrical arcs, etc. at an edge of the pixel electrode 310. The pixel-defining layer 150 may include an organic material such as PI or hexamethyldisiloxane (HMDSO). The pixel-defining layer 150 may be referred to as a second insulating layer.

The intermediate layer 320 of the organic light-emitting element 300 may include a low-molecular weight material or a high-molecular weight material. When the intermediate layer 320 includes a low-molecular weight material, the intermediate layer 320 may have a single-layer structure, or may have a multilayer structure in which a hole injection layer (HIL), a hole transport layer (HTL), an emission layer (EML), an electron transport layer (ETL), and an electron injection layer (EIL), etc. are stacked. The intermediate layer 320 may include various organic materials, e.g., copper phthalocyanine (CuPc), N,N'-Di(naphthalene-1-yl)-N, N'-diphenyl-benzidine (NPB), and tris-8-hydroxyquinoline aluminum ($Alq_3$). The aforementioned layers may be formed by vacuum deposition.

When the intermediate layer 320 includes a high-molecular weight material, the intermediate layer 320 may have a structure including an HTL and an EML. In this case, the HTL includes PEDOT, and the EML may include a polymer material such as a poly-phenylenevinylene (PPV)-based material and a polyfluorene-based material. The intermediate layer 320 may be formed by screen printing, ink-jet printing, laser induced thermal imaging, etc.

The intermediate layer 320 is not limited to the above description, and may have various structures.

The opposite electrode 330 may be above the display area DA and may cover the display area DA, as shown in FIG. 2. That is, the opposite electrodes 330 of the organic light-emitting elements 300 are integrally formed and thus may correspond to the pixel electrodes 310. The opposite electrode 330 may be a transparent (translucent) electrode or a reflective electrode. When the opposite electrode 330 is a transparent (translucent) electrode, the opposite electrode 330 may include a layer including a metal having a small work function, that is, Li, Ca, lithium fluoride (LiF)/Ca, LiF/Al, Al, Ag, Mg, and/or a combination thereof, and a transparent (translucent) layer including ITO, IZO, ZnO, $In_2O_3$, or the like. When the opposite electrode 330 is a reflective electrode, the opposite electrode 330 may include a layer including Li, Ca, LiF/Ca, LiF/Al, Al, Ag, Mg, and/or a combination thereof. However, the structure and materials of the opposite electrode 330 are not limited thereto, and may vary.

Because the display element, such as the organic light-emitting element 300, includes the opposite electrode 330, a preset electrical signal needs be transmitted to the opposite electrode 330 to display an image. Thus, an electrode power supply line 410 is in the peripheral area PA, and thus the preset electrical signal is transmitted to the opposite electrode 330.

When various conductive layers are formed in the display area DA, the electrode power supply line 410 may be formed simultaneously with the conductive layers by using the same material as the conductive layers. FIG. 2 shows that, like the source electrode 216 and the drain electrode 217 of the thin film transistor 210 are on the interlayer insulating layer 130 in the display area DA, the electrode power supply line 410 is on the interlayer insulating layer 130 in the peripheral area PA. In this case, when the source electrode 216 and the drain electrode 217 of the thin film transistor 210 are on the interlayer insulating layer 130 in the display area DA, it may be understood that the electrode power supply line 410 may be formed on the interlayer insulating layer 130 in the peripheral area PA during a same process as the source electrode 216 and the drain electrode 217 by using the same material. Accordingly, the electrode power supply line 410 has the same structure as the source electrode 216 and the drain electrode 217. However, one or more embodiments are not limited thereto. The electrode power supply line 410 may be formed in various manners such as, for example, a manner in which the electrode power supply line 410 is formed on the gate insulating layer 120 during a same process as the gate electrode 213 by using the same material as the gate electrode 213.

The opposite electrode 330 may directly contact the electrode power supply line 410, or as shown in FIG. 2, the opposite electrode 330 may be electrically connected to the electrode power supply line 410 via a protection conductive layer 420. That is, the protection conductive layer 420, which is on the planarization layer 140 that is the first insulating layer, extends toward the electrode power supply line 410 and thus may be electrically connected thereto. Accordingly, the opposite electrode 330 may contact the protection conductive layer 420 in the peripheral area PA, and the protection conductive layer 420 may also contact the electrode power supply line 410 in the peripheral area PA.

As shown in FIG. 2, because the protection conductive layer 420 is on the planarization layer 140, the protection conductive layer 420 may be formed on the planarization layer 140 during a same process as another component by using the same material, in the display area DA. In particular, the pixel electrode 310 is on the planarization layer 140 in the display area DA, the protection conductive layer 420 may be formed on the planarization layer 140 in the peripheral area PA during a same process as the pixel electrode 310 by using the same material. Thus, the protection conductive layer 420 may have the same structure as the pixel electrode 310. As shown in FIG. 2, the protection conductive layer 420 is not covered by the planarization layer 140, and may cover an exposed portion of the electrode power supply line 410.

As shown in FIG. 2, the planarization layer 140 may have openings 140b in the peripheral area PA to reduce or prevent external oxygen or moisture from penetrating the display area DA through the planarization layer 140. Also, when being formed, the protection conductive layer 420 may fill the openings 140b. Thus, the impurities otherwise penetrating the planarization layer 140 in the peripheral area PA may be effectively reduced or prevented from penetrating the planarization layer 140 in the display area DA.

The opening 140b of the planarization layer 140 may have various shapes. For example, referring to FIG. 3, the planarization layer 140 includes the openings 140b that are apart from each other along edges, or along a circumference, of the outer region of the display area DA. Alternatively, the planarization layer 140 may have the opening 140b that seamlessly surrounds the display area DA along the edges of the outer region thereof. The planarization layer 140 may have the openings 140b that seamlessly surround the display area DA.

On the opposite electrode 330 is a capping layer 160 that improves efficiency of light generated from the organic light-emitting element 300. The capping layer 160 covers the opposite electrode 330, and extends toward an outer side of the opposite electrode 330 such that an end portion 160a of the capping layer 160 is above the planarization layer 140 that is the first insulating layer. In particular, the end portion 160a of the capping layer 160 is located above the planarization layer 140 at an area between the opening 140b of the planarization layer 140 and an end portion 140a of the planarization layer 140. That is, the capping layer 160 may contact the protection conductive layer 420 under the opposite electrode 330 near the outer side of the opposite electrode 330. Because the opposite electrode 330 covers the display area DA and extends toward the outer region of the display area DA, the capping layer 160 also covers the display area DA and extends toward the peripheral area PA in the outer region of the display area DA. The capping layer 160 may include an organic material.

An encapsulation layer 500 is on the capping layer 160. The encapsulation layer 500 protects the organic light-emitting element 300 from external moisture, oxygen, or the like. The encapsulation layer 500 extends toward the display area DA, where the organic light-emitting element 300 exists, and also extends toward the peripheral area PA in the outer region of the display area DA. The encapsulation layer 500 may have a multilayer structure, as shown in FIG. 2. In detail, the encapsulation layer 500 may include a first inorganic encapsulation layer 510, an organic encapsulation layer 520, and a second inorganic encapsulation layer 530.

The first inorganic encapsulation layer 510 may cover the capping layer 160 and may include SiOx, SiNx, and/or silicon oxynitride. The first inorganic encapsulation layer 510 may be formed along a lower structure of the first inorganic encapsulation layer 510.

The organic encapsulation layer 520 has a thickness that is sufficient to cover (e.g., planarize) the first inorganic encapsulation layer 510, and thus an upper surface of the organic encapsulation layer 520 may be substantially flat over the entire display area DA. The organic encapsulation layer 520 may include at least one selected from the group consisting of PET, PEN, PC, PI, polyethylene sulfonate, polyoxymethylene, PAR, and hexamethyl disiloxane.

The second inorganic encapsulation layer 530 may cover the organic encapsulation layer 520 and may include SiOx, SiNx, and/or silicon oxynitride. The first inorganic encapsulation layer 510 and the second inorganic encapsulation layer 530 may have, or may cover, a greater area than the organic encapsulation layer 520. The first inorganic encapsulation layer 510 and the second inorganic encapsulation layer 530 may respectively contact outer sides of the organic encapsulation layer 520. That is, the organic encapsulation layer 520 may be protected from exposure to the outside due to the first inorganic encapsulation layer 510 and the second inorganic encapsulation layer 530.

The encapsulation layer 500 includes the first inorganic encapsulation layer 510, the organic encapsulation layer 520, and the second inorganic encapsulation layer 530, and thus, even should the encapsulation layer 500 crack, cracks do not propagate between the first inorganic encapsulation layer 510 and the organic encapsulation layer 520, or between the organic encapsulation layer 520 and the second inorganic encapsulation layer 530, due to the multilayer structure of the encapsulation layer 500. Accordingly, generation of a path via which external oxygen, moisture, or the like may penetrate the display area DA, may be prevented or reduced.

While the encapsulation layer 500 is formed, structures under the encapsulation layer 500 may be damaged. For example, the first inorganic encapsulation layer 510 may be formed by chemical vapor deposition (CVD), and when the first inorganic encapsulation layer 510 is formed by the CVD, a layer immediately below the first inorganic encapsulation layer 510 may be damaged. Thus, when the first inorganic encapsulation layer 510 is directly formed on the capping layer 160, the capping layer 160, which improves efficiency of light generated from the organic light-emitting element 300, may be damaged such that light efficiency of a display device 10 may degrade. Therefore, to reduce or prevent the damage of the capping layer 160 otherwise caused while forming the encapsulation layer 500, a protection layer 170 may be between the capping layer 160 and the encapsulation layer 500. The protection layer 170 may include LiF.

As described above, the capping layer 160 extends from the display area DA and the peripheral area PA in the outer region thereof. To reduce or prevent damage to the capping layer 160 at least in the display area DA, the protection layer 170 also extend from the display area DA and the peripheral area PA. In this case, although the capping layer 160 may be partially damaged in the peripheral area PA in the outer region of the display area DA, no display element exists in the peripheral area PA, and thus quality of an image recognized by a user would not degrade. Thus, as shown in FIGS. 2 and 3, the protection layer 170 extends toward at least the outer region of the display area DA, but an end portion 170a of the protection layer 170 may be closer to the display area DA than the end portion 160a of the capping layer 160. However, one or more embodiments are not limited thereto. The protection layer 170 may completely cover the capping layer 160, and thus the end portion 170a of the protection layer 170 may extend in the outer region (e.g., the peripheral area PA) farther than the end portion 160a of the capping layer 160.

When the encapsulation layer 500 is formed, more particularly, when the organic encapsulation layer 520 is formed, materials included in the organic encapsulation layer 520 are limitedly placed in a preset area. To this end, as shown in FIG. 2, a first dam 610 may be in the peripheral area PA. In particular, the buffer layer 110, the gate insulating layer 120, the interlayer insulating layer 130, and the planarization layer 140 that is the first insulating layer may exist in both the display area DA and in the peripheral area PA of the substrate 100, as shown in FIG. 2. The first dam 610 is in the peripheral area PA to be apart from the planarization layer 140.

The first dam 610 may have a multilayer structure. For example, the first dam 610 may include a first layer 611, a second layer 613, and a third layer 615 in a direction extending away from the substrate 100. The first layer 611 may be formed during a same process as the planarization layer 140 that is the first insulating layer in the display area DA by using the same material. The second layer 613 may be formed during a same process as the pixel-defining layer 150 that is the second insulating layer in the display area DA by using the same material. The third layer 615 may be additionally formed on the second layer 613 by using the same material as the second layer 613.

The first dam 610 may support masks, which are used when the intermediate layer 320 or the opposite electrode 330 of the organic light-emitting element 300 is formed, or when the capping layer 160 or the protection layer 170 is formed after the formation of the intermediate layer 320 or the opposite electrode 330, during the manufacture of the display device, and may prevent contact of components that are previously formed with the masks to thereby prevent damage. Also, when the organic encapsulation layer 520 is on the first inorganic encapsulation layer 510, the first dam 610 may prevent the material included in the organic encapsulation layer 520 from moving toward an edge of the substrate 100. In addition, due to separation from the planarization layer 140, the first dam 610 may reduce or prevent external moisture from penetrating the display area DA along the planarization layer 140 including an organic material.

As shown in FIG. 2, the first inorganic encapsulation layer 510 of the encapsulation layer 500 covers the first dam 610, extends toward an outer side of the first dam 610, and may contact the interlayer insulating layer 130 on the outer side of the first dam 610. Because the first inorganic encapsulation layer 510 and the interlayer insulating layer 130 include inorganic materials, the first inorganic encapsulation layer 510 and the interlayer insulating layer 130 may have great adhesion.

Also, a lowermost surface of the encapsulation layer 500 contacts the protection conductive layer 420 between the end portion 160a of the capping layer 160 and the first dam 610. That is, because the first inorganic encapsulation layer 510, which is a lowermost layer of the encapsulation layer 500, contacts the protection conductive layer 420 including the same material as the pixel electrode 310, adhesion between the encapsulation layer 500 and a layer below the encapsulation layer 500 may remain great.

If the end portion 160a of the capping layer 160 including an organic material were to extend from the end portion 140a of the planarization layer 140 toward the first dam 610, the encapsulation layer 500 contacts a layer including an organic material in an internal area of the first dam 610. As a result, adhesion between the encapsulation layer 500 and the layer below it may decrease. However, in the case of the display device 10 according to the present embodiment, the adhesion between the encapsulation layer 500 and the layer below it remains great between the end portion 140a of the planarization layer 140 and the first dam 610, and remains great on the outer side of the first dam 610. Thus, exfoliation of the encapsulation layer 500 from the lower layer may be effectively prevented or reduced during the manufacture of the display device 10 or during use of the display device 10 after manufacture.

In addition, the protection conductive layer 420 may include an uneven structure/uneven surface 422 at at least a portion of an upper surface thereof. In detail, the protection conductive layer 420 may include the uneven structure 422, which is in a region between the first dam 610 and the end portion 140a of the planarization layer 140, that directly contacts the encapsulation layer 500, that is, in a region where the electrode power supply line 410 overlaps the protection conductive layer 420. The uneven structure 422 makes the upper surface of the protection conductive layer 420 uneven, and thus an area of the upper surface of the protection conductive layer 420 may increase. Thus, the pixel electrode 310 and the protection conductive layer 420, which include the same material, may have different surface roughness. In detail, surface roughness of an upper surface of the pixel electrode 310 may be smaller than that of the upper surface of the protection conductive layer 420. Accordingly, an area of a region where the encapsulation layer 500 adheres to the lower layer increases, and thus the adhesion between the encapsulation layer 500 and the lower layer may increase.

The uneven structure 422 may have various shapes or patterns. For example, the uneven structure 422 may be directly on the upper surface of the protection conductive layer 420. However, one or more embodiments are not limited thereto, and the uneven structure 422 may be on the upper surface of the protection conductive layer 420 in various manners. This will be described with reference to FIGS. 4 to 7.

In other embodiments, the first inorganic encapsulation layer 510 may have an upper surface corresponding to the uneven structure 422 included in the upper surface of the protection conductive layer 420 (e.g., at least between the first dam 610 and the end portion 140a of the planarization layer 140). Accordingly, an area of a region where the first inorganic encapsulation layer 510 adheres to the second inorganic encapsulation layer 530 increases, and thus adhesion between the first inorganic encapsulation layer 510 and the second inorganic encapsulation layer 530 may increase.

Figure 4:
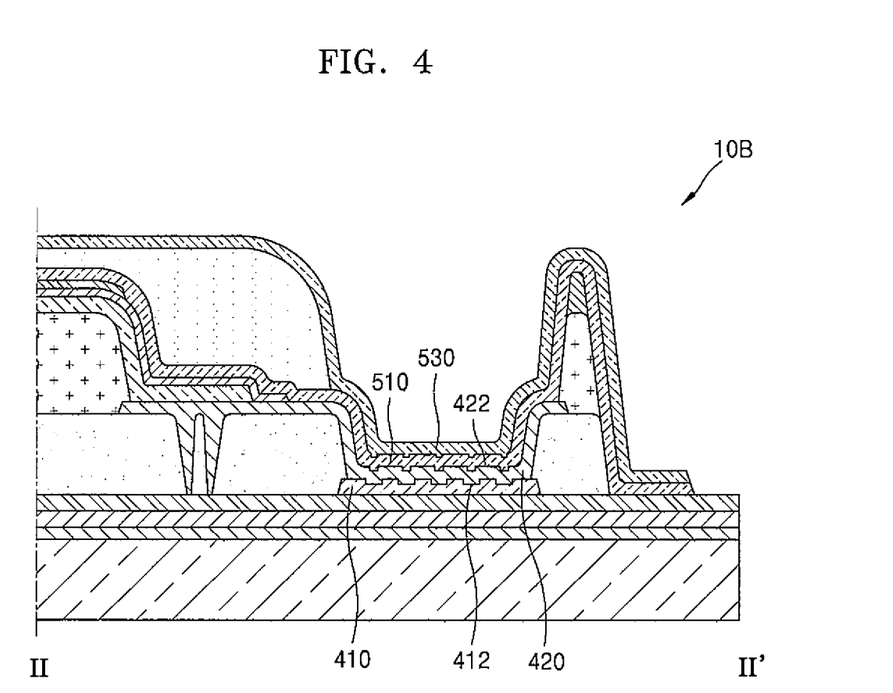
FIG. 4 is a schematic cross-sectional view showing an example of a cross-section taken along the line II-II' of FIG. 1.

FIG. 4 is a cross-sectional view showing an example of a cross-section taken along the line II-II' of FIG. 1.

A display device 10B of FIG. 4 is different from the display device 10 shown in FIGS. 1 to 3 because of a shape of the electrode power supply line 410. Referring to FIG. 4, the electrode power supply line 410 of the display device 10B may include a first pattern 412. The first pattern 412 does not correspond to a flat upper surface of the electrode power supply line 410, and the protection conductive layer 420 that is on the electrode power supply line 410 has an upper surface corresponding to the first pattern 412 of the upper surface of the electrode power supply line 410 in a region where the electrode power supply line 410 overlaps the protection conductive layer 420. Thus, the upper surface of the protection conductive layer 420 may have the uneven structure 422. Therefore, the area of the region where the first inorganic encapsulation layer 510 adheres to the second inorganic encapsulation layer 530 increases, and adhesion between the protection conductive layer 420 and the first inorganic encapsulation layer 510 contacting the protection conductive layer 420 may increase.

For example, the first pattern 412 may have an uneven structure that is directly on the upper surface of the electrode power supply line 410. As another example, the first pattern 412 may include holes that penetrate the electrode power supply line 410. In this case, the holes may have various shapes, such as a circular shape and a polygonal shape, and may be regularly or irregularly arranged.

Also, in other embodiments, the first inorganic encapsulation layer 510 may have an upper surface corresponding to the uneven structure 422 included in the upper surface of the protection conductive layer 420. Accordingly, adhesion between the first inorganic encapsulation layer 510 and the second inorganic encapsulation layer 530 may increase.

Figure 5:
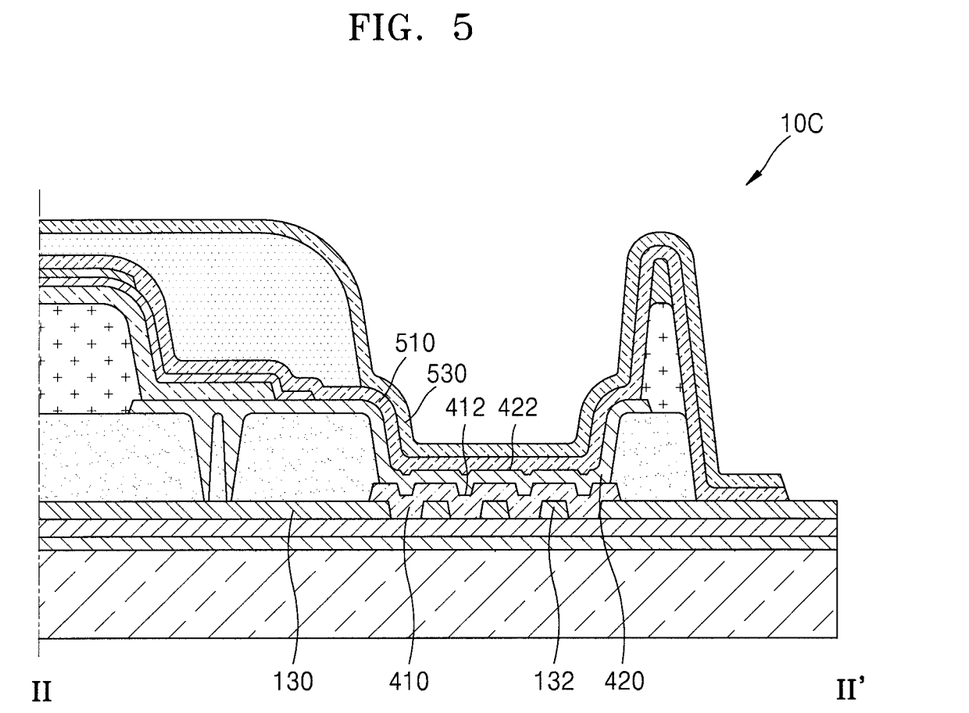
FIG. 5 is a schematic cross-sectional view showing another example of a cross-section taken along the line II-II' of FIG. 1.

FIG. 5 is a cross-sectional view showing another example of a cross-section taken along the line II-II' of FIG. 1.

Referring to a display device 10C of FIG. 5, in a region where the electrode power supply line 410 overlaps the protection conductive layer 420, at least one of layers under the electrode power supply line 410 includes a second pattern 132, and accordingly, the upper surface of the protection conductive layer 420 may have the uneven structure 422. For example, the second pattern 132 may include the same material as, or may be formed in, the interlayer insulating layer 130, and may therefore be formed during the same process as the interlayer insulating layer 130.

When the interlayer insulating layer 130 has the second pattern 132 in the region where the electrode power supply line 410 overlaps the protection conductive layer 420, the electrode power supply line 410 is stacked on the interlayer insulating layer 130 in the region corresponding to the second pattern 132, and thus the upper surface of the electrode power supply line 410 may have the first pattern 412 corresponding to the second pattern 132. As a result, the protection conductive layer 420 on the electrode power supply line 410 has the upper surface corresponding to the first pattern 412 of the electrode power supply line 410, and the upper surface of the protection conductive layer 420 has the uneven structure 422, such that an area of a region where the protection conductive layer 420 adheres to the first inorganic encapsulation layer 510 increases, and such that the adhesion between the protection conductive layer 420 and the first inorganic encapsulation layer 510 may increase.

However, one or more embodiments are not limited thereto. The second pattern 132 may be included in the gate insulating layer (e.g., gate insulating layer 120 of FIG. 2) under the interlayer insulating layer 130. Also, as shown in the drawings, the first inorganic encapsulation layer 510 may have the upper surface corresponding to the uneven structure 422 included in the upper surface of the protection conductive layer 420, and the adhesion between the first inorganic encapsulation layer 510 and the second inorganic encapsulation layer 530 may increase.

Figure 6:
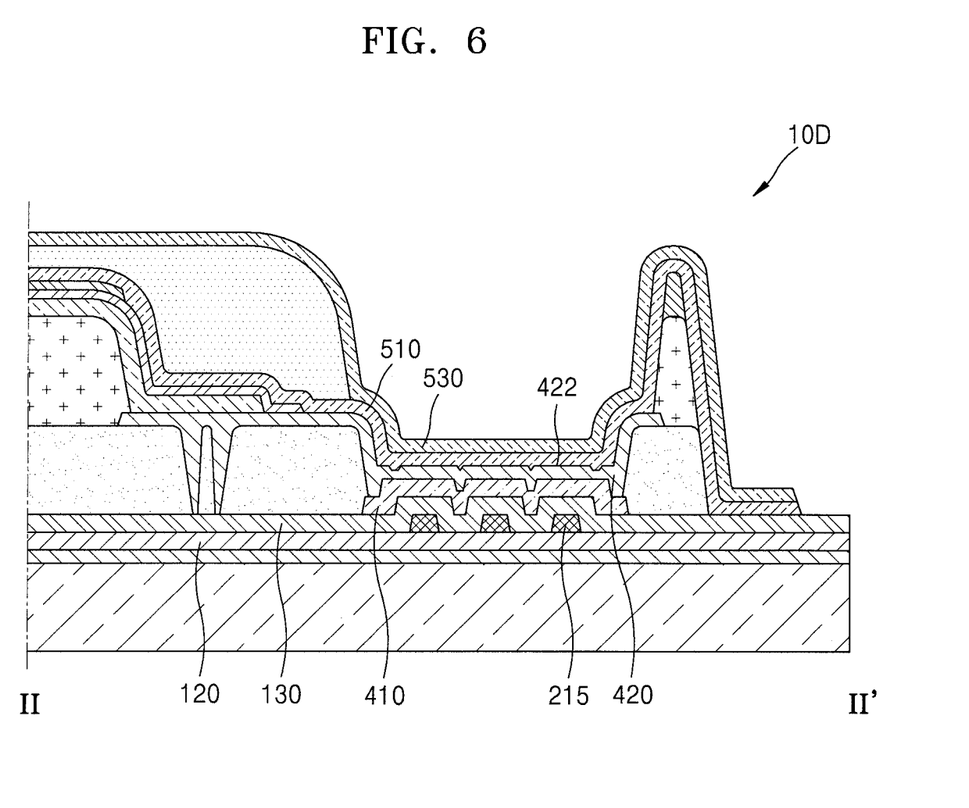
FIG. 6 is a schematic cross-sectional view showing another example of a cross-section taken along the line II-II' of FIG. 1.

FIG. 6 is a cross-sectional view showing another example of a cross-section taken along the line II-II' of FIG. 1.

Referring to a display device 10D of FIG. 6, the display device 10D may include dummy patterns 215 under the electrode power supply line 410 in the region where the electrode power supply line 410 overlaps the protection conductive layer 420. For example, the dummy pattern 215 may be on the gate insulating layer 120. In this case, when the gate electrode (e.g., the gate electrode 213 of FIG. 2) of the thin film transistor (e.g., thin film transistor 210 of FIG. 2) is on the gate insulating layer 120 in the display area (e.g., display area DA of FIG. 1), it may be understood that the dummy pattern 215 may be formed on the gate insulating layer 120 during a same process as the gate insulating layer 120, and may include the same material in the peripheral area (e.g., the peripheral area PA of FIG. 1).

The dummy pattern 215 may have various shapes. For example, the dummy patterns 215 may be patterns that are electrically insulated from each other, and may be regularly or irregularly arranged. In this case, the dummy patterns 215 may have shapes, such as a circular pattern or polygonal shape.

When the dummy patterns 215 are on the gate insulating layer 120 in the region, then the interlayer insulating layer 130, the electrode power supply line 410, and the protection conductive layer 420, which are sequentially stacked on the gate insulating layer 120, may have shapes corresponding to the dummy pattern 215. Thus, the upper surface of the protection conductive layer 420 may have the uneven structure 422 corresponding to the dummy pattern 215, and thus the adhesion between the protection conductive layer 420 and the first inorganic encapsulation layer 510 may increase. In the region where the electrode power supply line 410 overlaps the protection conductive layer 420, the first inorganic encapsulation layer 510 may have the upper surface corresponding to the uneven structure 422 included in the upper surface of the protection conductive layer 420, and thus the adhesion between the first inorganic encapsulation layer 510 and the second inorganic encapsulation layer 530 may increase.

Figure 7:
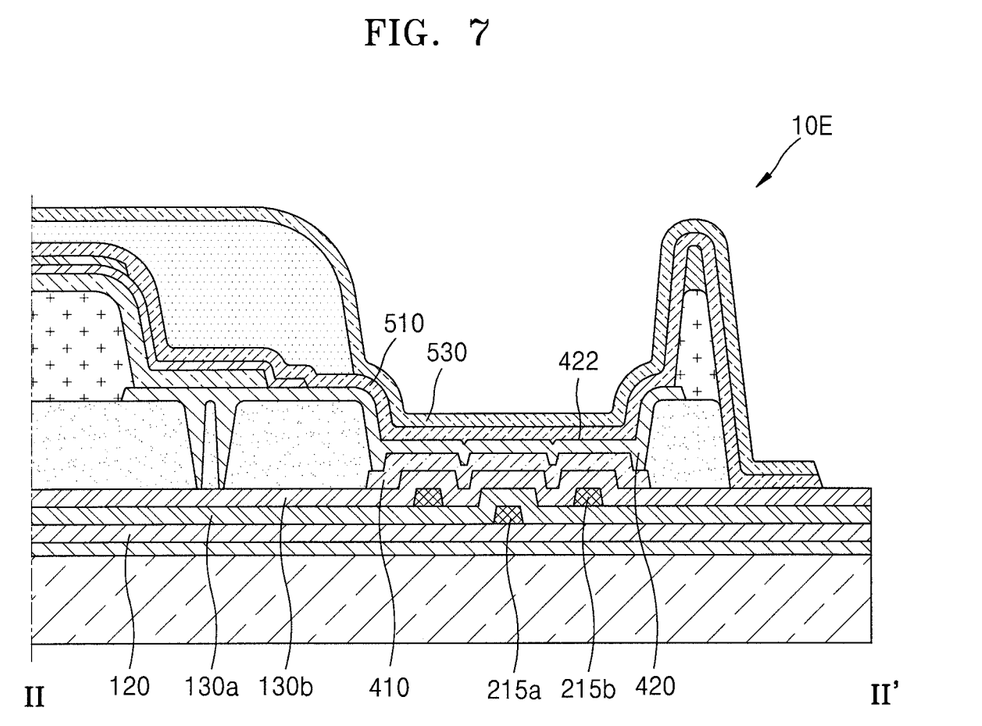
FIG. 7 is a schematic cross-sectional view showing another example of a cross-section taken along the line II-II' of FIG. 1.

FIG. 7 is a cross-sectional view showing another example of a cross-section taken along the line II-II' of FIG. 1.

Referring to a display device 10E of FIG. 7, the display device 10E may include a first dummy pattern 215a and a second dummy pattern 215b under the electrode power supply line 410 in a region where the electrode power supply line 410 overlaps the protection conductive layer 420. For example, a storage capacitor electrically connected to the thin film transistor (e.g., thin film transistor 210 of FIG. 2) may include a first electrode and a second electrode. The first dummy pattern 215a may be on the same layer as the first electrode of the storage capacitor, and the second dummy pattern 215b may be on the same layer as the second electrode of the storage capacitor.

In more detail, the first dummy pattern 215a may be on the gate insulating layer 120, and the second dummy pattern 215b may be on a first interlayer insulating layer 130a between the first electrode and the second electrode of the storage capacitor. Also, the second dummy pattern 215b may be covered by a second interlayer insulating layer 130b that is on the second electrode of the storage capacitor. The first dummy pattern 215a and the second dummy pattern 215b do not overlap each other, and may be vertically unaligned. That is, the first dummy pattern 215a and the second dummy pattern 215b may be alternately arranged along a direction toward an outer circumference of the display device 10E.

When the first dummy pattern 215a and the second dummy pattern 215b are alternately arranged in the above regions, the first interlayer insulating layer 130a, the second interlayer insulating layer 130b, the electrode power supply line 410, and the protection conductive layer 420, which are sequentially stacked on the gate insulating layer 120, may have shapes corresponding to the first and second dummy patterns 215a and 215b. Thus, the upper surface of the protection conductive layer 420 may have the uneven structure 422, and thus the adhesion between the protection conductive layer 420 and the first inorganic encapsulation layer 510 may increase. In other embodiments, the first inorganic encapsulation layer 510 may have the upper surface corresponding to the uneven structure 422 included in the upper surface of the protection conductive layer 420 in the above regions, and thus the adhesion between the first inorganic encapsulation layer 510 and the second inorganic encapsulation layer 530 may increase.

Figure 8:
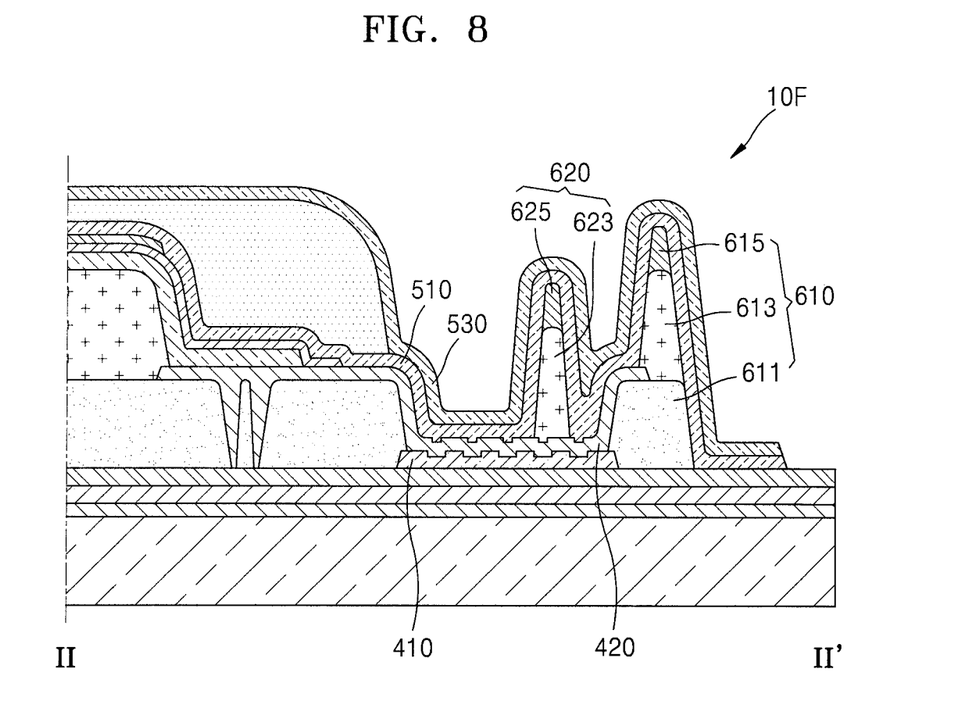
FIG. 8 is a schematic cross-sectional view showing another example of a cross-section taken along the line II-II' of FIG. 1.

FIG. 8 is a cross-sectional view showing another example of a cross-section taken along the line II-II' of FIG. 1.

A display device 10F of FIG. 8 is different from the display device 10 of FIGS. 1 to 3 because the display device 10F further includes a second dam 620. The second dam 620 may be apart from the planarization layer 140, and may be on an inner side of the first dam 610. That is, the second dam 620 may be above a portion of the electrode power supply line 410 that corresponds to the protection conductive layer 420.

As described above, the first dam 610 may have a structure in which the first layer 611, the second layer 613, and the third layer 615 are stacked, and in this case, the second dam 620 may include a lower layer 623, which may be formed during the same process as the second layer 613 of the first dam 610 by using the same material, and an upper layer 625 may be formed on the lower layer 623 during a same process as the third layer 615 of the first dam 610 by using the same material. Thus, the second dam 620 may have a lower height than the first dam 610, the heights of the first dam 610 and the second dam 620 are heights from the substrate (e.g., the substrate 100 of FIG. 1).

The second dam 620 may prevent the material included in the organic encapsulation layer (e.g., organic encapsulation layer 520 of FIG. 2) from overflowing toward an outer side of the second dam 620. Although the material included in the organic encapsulation layer partially overflows toward the outer side of the second dam 620, the material may not further move toward the edge of the substrate 100 because a location of the second dam 620 is fixed by the first dam 610.

The first inorganic encapsulation layer 510 and the second inorganic encapsulation layer 530 may cover the first dam 610, and thus may contact each other on the outer side of the first dam 610. Also, the first inorganic encapsulation layer 510 contacts the interlayer insulating layer 130 including an inorganic material on the outer side of the first dam 610, and thus may effectively prevent the penetration of external moisture, etc.

In addition, in the region where the electrode power supply line 410 overlaps the protection conductive layer 420, the protection conductive layer 420 may have the uneven structure, and thus the adhesion between the protection conductive layer 420 and the first inorganic encapsulation layer 510 may increase. Furthermore, because the second dam 620 is on the uneven structure, damage, for example, dislocation of the second dam 620, etc., may be prevented during manufacture of a display device.

According to the one or more embodiments, a display device in which exfoliation between components may be prevented or reduced may be implemented. However, the scope of the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their functional equivalents.

What is claimed is:

1. A display device comprising:
    a substrate comprising a display area, and a peripheral area in an outer region of the display area;
    a first insulating layer on the substrate across the display area and the peripheral area;
    a first dam in the peripheral area and separated from the first insulating layer;
    an electrode power supply line on the substrate, and comprising a part between the first insulating layer and the first dam;
    a protection conductive layer on the first insulating layer, extending over the electrode power supply line, electrically connected to the electrode power supply line;
    a pixel electrode on the first insulating layer in the display area;
    an opposite electrode on the pixel electrode, and contacting the protection conductive layer by extending to the peripheral area; and an encapsulation layer on the opposite electrode, and having a lower surface that contacts an upper surface of the protection conductive layer in the peripheral area in a region where the protection conductive layer overlaps the electrode power supply line,
wherein the protection conductive layer comprises an uneven structure on the upper surface thereof where the protection conductive layer overlaps and contacts both the electrode power supply line and the encapsulation layer,
wherein the encapsulation layer comprises an uneven structure on the lower surface thereof corresponding to the uneven structure on the upper surface of the protection conductive layer where the encapsulation layer contacts the protection conductive layer between the first insulating layer and the first dam,
wherein the uneven structure of the upper surface of the protection conductive layer being directly above a portion of the protection conductive layer that both contacts the electrode power supply line and the encapsulation layer and is spaced apart from both of the first insulating layer and the first dam.

2. The display device of claim 1, wherein the electrode power supply line comprises a first pattern, and
wherein the upper surface of the protection conductive layer comprises an uneven structure corresponding to the first pattern.

3. The display device of claim 1, wherein, in the region where the protection conductive layer overlaps at least the electrode power supply line, at least one layer under the electrode power supply line comprises a second pattern, and
wherein the upper surface of the protection conductive layer comprises an uneven structure corresponding to the second pattern.

4. The display device of claim 3, further comprising a thin film transistor electrically connected to the pixel electrode,
wherein an interlayer insulating layer on a gate electrode of the thin film transistor extends toward the peripheral area, and comprises the second pattern in the peripheral area.

5. The display device of claim 1, further comprising a capping layer between the opposite electrode and the encapsulation layer, extending toward an outer side of the opposite electrode, and having an end portion on the first insulating layer.

6. The display device of claim 5, wherein the first insulating layer defines an opening in the peripheral area, and
wherein the end portion of the capping layer is between an end portion of the first insulating layer and the opening.

7. The display device of claim 6, wherein the protection conductive layer fills the opening of the first insulating layer.

8. The display device of claim 5, further comprising a protection layer between the capping layer and the encapsulation layer.

9. The display device of claim 1, wherein the encapsulation layer comprises a first inorganic encapsulation layer, an organic encapsulation layer, and a second inorganic encapsulation layer, which are sequentially stacked, and
wherein the upper surface of the protection conductive layer comprises the uneven structure that contacts a lower surface of the first inorganic encapsulation layer.

10. The display device of claim 9, wherein the first inorganic encapsulation layer and the second inorganic encapsulation layer contact each other at an outer circumference of the first dam.

11. The display device of claim 9, wherein, in the region where the protection conductive layer overlaps at least the electrode power supply line, the first inorganic encapsulation layer comprises an upper surface corresponding to the uneven structure.

12. The display device of claim 1, further comprising a second dam between the first dam and the first insulating layer, wherein at least a portion of the second dam is on the protection conductive layer.

13. The display device of claim 12, wherein a height of the first dam from the substrate is greater than a height of the second dam from the substrate.

14. A display device comprising:
a substrate comprising a display area, and a peripheral area in an outer region of the display area;
a first insulating layer on the substrate across the display area and the peripheral area;
a first dam in the peripheral area and separated from the first insulating layer;
an electrode power supply line on the substrate, and comprising a part between the first insulating layer and the first dam;
a protection conductive layer on the first insulating layer, extending over the electrode power supply line, electrically connected to the electrode power supply line, and comprising an uneven structure on an upper surface thereof;
a pixel electrode on the first insulating layer in the display area;
an opposite electrode on the pixel electrode, and contacting the protection conductive layer by extending to the peripheral area;
an encapsulation layer on the opposite electrode, and having a lower surface that contacts the upper surface of the protection conductive layer in the peripheral area in a region where the protection conductive layer overlaps the electrode power supply line; and
a dummy pattern under the electrode power supply line in the region where the protection conductive layer overlaps at least the electrode power supply line.

15. The display device of claim 14, further comprising a thin film transistor electrically connected to the pixel electrode, and comprising a gate electrode,
wherein the dummy pattern comprises a same material as the gate electrode.

* * * * *